(12) United States Patent
Chang

(10) Patent No.: US 12,317,487 B2
(45) Date of Patent: May 27, 2025

(54) SEMICONDUCTOR STRUCTURE AND FABRICATION METHOD THEREOF, AND MEMORY

(71) Applicant: CHANGXIN MEMORY TECHNOLOGIES, INC., Hefei (CN)

(72) Inventor: Heng-Chia Chang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 567 days.

(21) Appl. No.: 17/847,245

(22) Filed: Jun. 23, 2022

(65) Prior Publication Data
US 2023/0189518 A1    Jun. 15, 2023

(30) Foreign Application Priority Data
Dec. 15, 2021   (CN) .......................... 202111539946.1

(51) Int. Cl.
*H10D 84/01*    (2025.01)
*H10B 41/35*    (2023.01)
*H10B 41/41*    (2023.01)

(52) U.S. Cl.
CPC ............. *H10B 41/41* (2023.02); *H10B 41/35* (2023.02)

(58) Field of Classification Search
CPC ... H10D 88/101; H10D 88/01; H10D 84/0191
See application file for complete search history.

(56) References Cited

U.S. PATENT DOCUMENTS

2023/0178549 A1* 6/2023 Suk .................... H10D 84/0186
257/369

FOREIGN PATENT DOCUMENTS

CN    202394957 U    8/2012

\* cited by examiner

*Primary Examiner* — Jaehwan Oh
(74) *Attorney, Agent, or Firm* — Kilpatrick Townsend & Stockton LLP

(57) ABSTRACT

Embodiments of the present disclosure relate to the field of semiconductors, and provide a semiconductor structure and a fabrication method thereof, and a memory. The semiconductor structure includes: a base substrate including a first side and a second side opposite to each other; a first device layer including a first device, the first device layer being arranged on the first side of the base substrate; and a second device layer including a second device, the second device layer being arranged on the second side of the base substrate. At least part of the first device and at least part of the second device share a first doped region.

20 Claims, 7 Drawing Sheets

SEMICONDUCTOR STRUCTURE AND FABRICATION METHOD THEREOF, AND MEMORY

CROSS REFERENCE TO RELATED APPLICATION

This application claims priority to Chinese Patent Application No. 202111539946.1, titled "SEMICONDUCTOR STRUCTURE AND FABRICATION METHOD THEREOF, AND MEMORY" and filed to the China National Intellectual Property Administration on Dec. 15, 2021, the entire contents of which are incorporated herein by reference.

TECHNICAL FIELD

Embodiments of the present disclosure relate to the field of semiconductors, and more particularly, to a semiconductor structure and a fabrication method thereof, and a memory.

BACKGROUND

According to Moore's Law, number of electronic devices that may be housed in a semiconductor structure doubles approximately every 18 months. To further improve an integration density of the electronic devices in the semiconductor structure, two semiconductor structures including a plurality of electronic devices may be integrated into one package structure to form one semiconductor structure including electronic devices having a higher integration density.

However, for a single semiconductor structure, various electronic devices are fabricated on one side of a base substrate. An area of the base substrate is limited, such that it is more and more difficult to arrange more electronic devices on the limited area of the base substrate. Therefore, there is an urgent need to design a semiconductor structure including electronic devices having a higher integration density in a limited area.

SUMMARY

Embodiments of the present disclosure provide a semiconductor structure and a fabrication method thereof, and a memory, which are at least advantageous to improving an integration density of devices on a base substrate and improving a utilization rate of the base substrate.

According to some embodiments of the present disclosure, one aspect of the embodiments of the present disclosure provides a semiconductor structure, including: a base substrate including a first side and a second side opposite to each other; a first device layer including a first device, the first device layer being arranged on the first side of the base substrate; and a second device layer including a second device, the second device layer being arranged on the second side of the base substrate. At least part of the first device and at least part of the second device share a first doped region.

According to some embodiments of the present disclosure, another aspect of the embodiments of the present disclosure also provides a memory including the semiconductor structure described in any one of the above embodiments.

According to some embodiments of the present disclosure, still another aspect of the embodiments of the present disclosure also provides a method for fabricating a semiconductor structure. The method includes: providing a base substrate including a first side and a second side opposite to each other; forming a first doped region in the base substrate; forming a first device layer including a first device in the first side of the base substrate; and forming a second device layer including a second device in the second side of the base substrate. At least part of the first device and at least part of the second device share the first doped region.

BRIEF DESCRIPTION OF THE DRAWINGS

Exemplary descriptions are made to one or more embodiments with reference to pictures in the corresponding drawings, and these exemplary descriptions do not constitute limitations on the embodiments, and elements with the same reference numerals in the drawings are denoted as similar elements. Unless otherwise stated, the figures in the accompanying drawings do not constitute a scale limitation.

DETAILED DESCRIPTION

Figure 1:
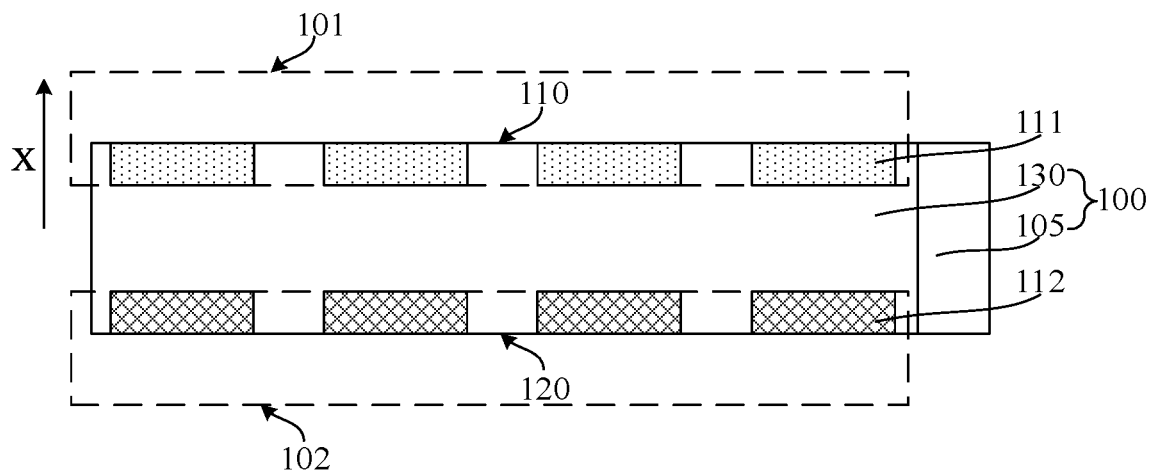
FIG. 1 to FIG. 12 are twelve schematic structural diagrams of a semiconductor structure according to an embodiment of the present disclosure.

As can be known from the background art that in a semiconductor structure, an integration density of devices on a base substrate and utilization rate of the base substrate need to be improved.

After analysis, it is found that although two or more semiconductor structures including a plurality of electronic devices may be integrated into the same package structure, each semiconductor structure in the package structure actually is merely on one side of the base substrate. That is, an integrated circuit including a plurality of electronic devices is formed on a side of the base substrate having an active region. However, the other side of the base substrate has no functional integrated circuits. Layout areas of the electronic devices on the side of the base substrate having the active region are limited by the base substrate itself, and micron circuit manufacturing technologies for the semiconductor structure are limited. Because of these reasons, it is not easy to further increase a layout density of the electronic devices on the side of the base substrate having the active region without increasing the layout area.

In addition, at a package level, it is also not easy to further reduce volume or further increase the layout density of the electronic devices while enabling a single package structure to include a plurality of semiconductor structures. For example, the plurality of semiconductor structures will require more substrates or space for lead frames, or require to use more electrical connection structures, which will further occupy the limited package space.

Embodiments of the present disclosure provide a semiconductor structure and a fabrication method thereof, and a memory. In the semiconductor structure, a first device layer is provided on a first side of a base substrate, and a second device layer is provided on a second side of the base substrate. That is, both the two opposite sides of the base substrate are provided with electronic devices, which is advantageous to improving an integration density of the electronic devices on the base substrate without increasing a volume of the base substrate. Moreover, at least part of first devices and at least part of second devices on the two opposite sides of the base substrate share a first doped region, which is advantageous to improving utilization rate of the base substrate.

The embodiments of the present disclosure will be described in detail below in conjunction with the accompanying drawings. However, a person of ordinary skill in the art may understand that in the embodiments of the present disclosure, many technical details are put forward such that a reader may better understand the present disclosure. However, the technical solutions requested to be protected by the embodiments of the present disclosure may also be implemented even without these technical details or various variations and modifications based on the following embodiments.

An embodiment of the present disclosure provides a semiconductor structure, and the semiconductor structure provided by this embodiment of the present disclosure will be described in detail below with reference to the accompanying drawings. FIG. 1 to FIG. 12 are twelve schematic structural diagrams of a semiconductor structure according to an embodiment of the present disclosure.

Referring to FIG. 1, the semiconductor structure includes: a base substrate 100 including a first side 110 and a second side 120 opposite to each other; a first device layer 101 including a first device 111, the first device layer 101 being arranged on the first side 110 of the base substrate 100; and a second device layer 102 including a second device 112, the second device layer 102 being arranged on the second side 120 of the base substrate 100. At least part of the first device 111 and at least part of the second device 112 share a first doped region 130.

The first device 111 and the second device 112 are electronic devices commonly used in the semiconductor structure, such as transistors or diodes. Therefore, for the same base substrate 100, both the two opposite sides of the base substrate 100 are provided with the electronic devices, which is advantageous to improving the integration density of the electronic devices on the base substrate 100 without increasing a surface area of the first side 110. Moreover, at least part of the first device 111 and at least part of the second device 112 share the first doped region 130, which is advantageous to improving utilization rate of the base substrate 100.

It is to be noted that an example is taken in FIG. 1, where the base substrate 100 includes the first doped region 130 and a substrate 105, and all the first devices 111 and all the second devices 112 share the first doped region 130. The substrate 105 may be configured to support other functional devices in the semiconductor structure. In practical applications, the entire region of the base substrate 100 may be the first doped region 130, or part of the first devices 111 and part of the second devices 112 share the first doped region 130, and the remaining first devices 111 and the remaining second devices 112 share the substrate 105.

In addition, an example is taken in FIG. 1, wherein the first device 111 is completely embedded into the first doped region 130, and only a surface flush with the first side 110 is exposed, and the second device 112 is completely embedded into the first doped region 130, and only a surface flush with the second side 120 is exposed. In practical applications, the first device 111 may be partially embedded into the first doped region 130, and the second device 112 may also be partially embedded into the first doped region 130. The embodiments of the present disclosure do not impose limitations on degree of the first device 111 and the second device 112 being embedded into the first doped region 130. Moreover, the embodiments of the present disclosure do not impose limitations on number of the first devices 111 and second devices 112 sharing the first doped region 130, and also do not impose limitations on number of the first devices 111 and second devices 112 sharing the substrate 105.

In some embodiments, along a direction X directing from the first side 110 to the second side 120, a thickness of the first doped region 130 ranges from 700 nm to 1,500 nm. In this way, it is advantageous to making doped elements in the first doped region 130 to be distributed uniformly, improving stability of electrical properties of the first doped region 130, and reducing the thickness of the semiconductor structure.

Figure 2:
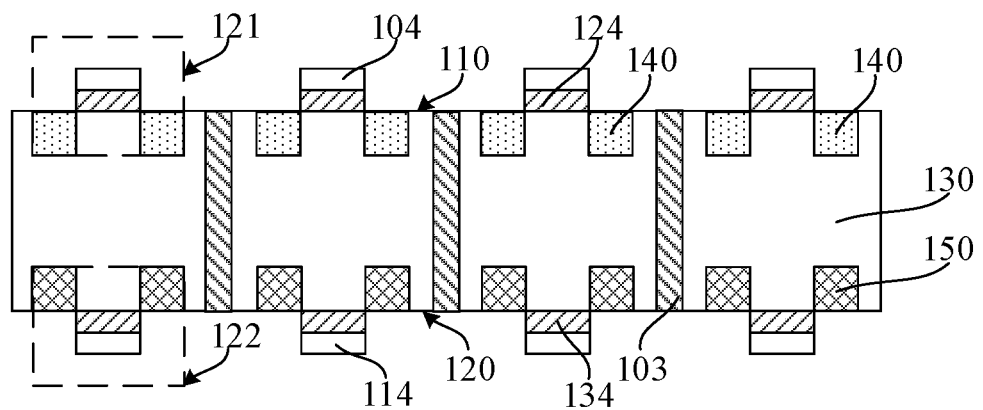
Figure 3:
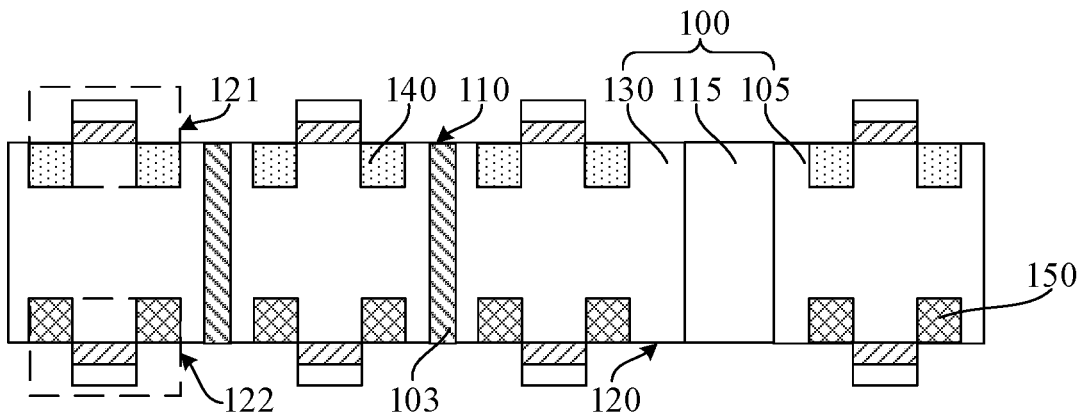

In some embodiments, referring to FIG. 2 and FIG. 3, the first device 111 includes first transistors 121, the second device 112 includes second transistors 122, and at least part of the first transistors 121 and at least part of the second transistors 122 share the first doped region 130.

It is to be noted that in some examples, referring to FIG. 2, all the first transistors 121 and all the second transistors 122 share the first doped region 130. In other examples, referring to FIG. 3, the first doped region 130 is a partial region of the base substrate 100, the base substrate 100 also includes the substrate 105 and a transition layer 115 between the substrate 105 and the first doped region 130, and part of the first transistors 121 and part of the second transistors 122 share the substrate 105.

The first transistors 121 and the second transistors 122 are described in detail below based on two embodiments.

In some embodiments, the first transistors 121 and the second transistors 122 include P-type transistors, the first doped region 130 includes an N-type doped region, and the P-type transistors share the N-type doped region. In this way, when the first transistors 121 need to be enabled, the first doped region 130 provides an N-type channel region to the first transistors 121; and when the second transistors 122 need to be enabled, the first doped region 130 provides the N-type channel region to the second transistors 122. In this way, when the first transistors 121 and the second transistors 122 need to be enabled, the first doped region 130 provides the N-type channel region to the first transistors 121 and the second transistors 122.

In some other embodiments, the first transistors 121 and the second transistors 122 include N-type transistors, the first doped region 130 includes a P-type doped region, and the N-type transistors share the P-type doped region. In this way, when the first transistors 121 need to be enabled, the first doped region 130 provides a P-type channel region to the first transistors 121; and when the second transistors 122 need to be enabled, the first doped region 130 provides the P-type channel region to the second transistors 122. In this way, when the first transistors 121 and the second transistors 122 need to be enabled, the first doped region 130 provides the P-type channel region to the first transistors 121 and the second transistors 122.

Figure 4:
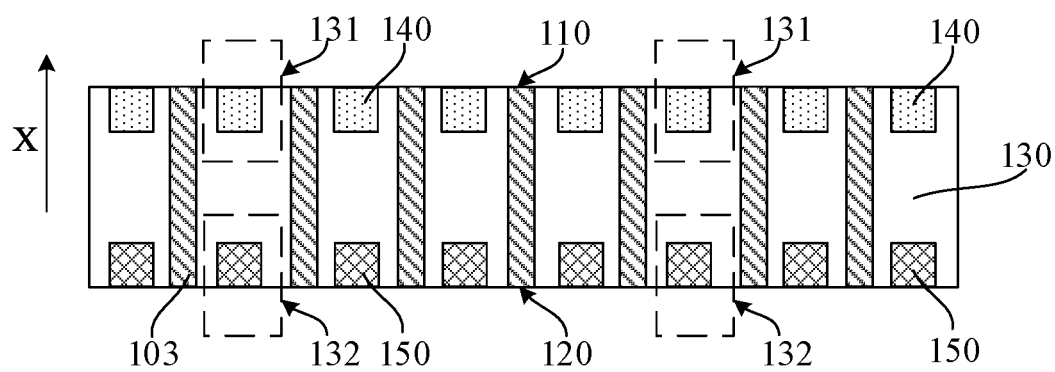

In some embodiments, referring to FIG. 4, the first device 111 includes first diodes 131, the second device 112 includes second diodes 132, and at least part of the first diodes 131 and at least part of the second diodes 132 share the first doped region 130.

It is to be noted that in some examples, referring to FIG. 4, the entire region of the base substrate 100 (referring to FIG. 3) is the first doped region 130, and all the first diodes 131 and all the second diodes 132 share he first doped region 130. In other embodiments, the first doped region may be a partial region of the base substrate. In addition, part of the first diodes and part of the second diodes may also share a region of the base substrate other than the first doped region.

In the above embodiment, referring to FIG. 2 to FIG. 4, a first side of the first doped region 130 is provided with a plurality of second doped regions 140, and a second side of the first doped region 130 is provided with a plurality of third doped regions 150. The plurality of second doped regions 140 and the plurality of third doped regions 150 have the same doping type, and the first doped region 130 and the plurality of second doped regions 140 have different doping types.

The plurality of second doped regions 140 and the plurality of third doped regions 150 have the same doping type, and the first doped region 130 and the plurality of second doped regions 140 have different doping types. The first device 111 includes the first transistors 121, and the second device 112 includes the second transistors 122, it is advantageous to ensuring that the first transistors 121 and the second transistors 122 are transistors of the same type. In this case, the first transistors 121 and the second transistors 122 can share the first doped region 130, such that a channel region is formed when the transistors are enabled. When the first device 111 includes the first diodes 131 and the second device 112 includes the second diodes 132, it is advantageous to ensuring that the plurality of second doped regions 140 and part of the first doped region 130 may be combined to form the first diodes 131, and the plurality of third doped regions 150 and part of the first doped region 130 may be combined to form the second diodes 132.

In some embodiments, along the direction X directing from the first side 110 to the second side 120, the thickness of each of the plurality of second doped regions 140 ranges from 50 nm to 200 nm, and the thickness of each of the plurality of third doped regions 150 ranges from 50 nm to 200 nm. It is to be noted that the thickness of each of the plurality of second doped regions 140 may be adjusted according to required electrical properties of the first device 111, and the thickness of each of the plurality of third doped regions 150 may be adjusted according to required electrical properties of the second device 112. In addition, the thickness of each of the plurality of second doped regions 140 and the thickness of each of the plurality of third doped regions 150 are within the above range, which is advantageous to ensuring a suitable spacing between each of the plurality of second doped regions 140 and each of the plurality of third doped regions 150, thereby avoiding mutual interference between each of the plurality of second doped regions 140 and each of the plurality of third doped regions 150.

An orthographic projection of each of the plurality of second doped regions 140 on the base substrate 100 at least partially overlaps with an orthographic projection of each of the plurality of third doped regions 150 on the base substrate 100. In some examples, referring to FIG. 2 and FIG. 4, the orthographic projection of each of the plurality of second doped regions 140 on the base substrate 100 completely overlaps with the orthographic projection of each of the plurality of third doped regions 150 on the base substrate 100. That is, each of the plurality of second doped regions 140 and each of the plurality of third doped regions 150 are exactly mirrored, this is advantageous to subsequent mirror setting of capacitor array layers or other functional device layers on the first device 111 and the second device 112, which is advantageous to reducing wiring difficulty for the semiconductor structure and improving stability of the overall electrical properties of the semiconductor structure. In some other examples, referring to FIG. 5, the orthographic projection of each of the plurality of second doped regions 140 on the base substrate 100 may partially overlap with the orthographic projection of each of the plurality of third doped regions 150 on the base substrate 100. In other examples, each of the plurality of second doped regions 140 and each of the plurality of third doped regions 150 may be completely staggered. That is, the orthographic projection of each of the plurality of second doped regions 140 on the base substrate 100 may completely not overlap with the orthographic projection of each of the plurality of third doped regions 150 on the base substrate 100.

In some embodiments, referring to FIG. 2 to FIG. 5, along the direction X directing from the first side 110 to the second side 120, the first doped region 130 is also provided with an isolation structure 103 penetrating through the first doped region 130, and the isolation structure 103 is positioned between adjacent two of the first devices 111 and between adjacent two of the second devices 112.

It is to be noted that in some examples, referring to FIG. 2 and FIG. 3, the first device 111 includes the first transistors 121, the second device 112 includes the second transistors 122, and the isolation structure 103 is positioned between adjacent two of the first transistors 121 and between adjacent two of the second transistors 122. This is advantageous to realizing insulation between adjacent two of the first transistors 121 and insulation between adjacent two of the second transistors 122, which is advantageous to avoiding electric leakage in the semiconductor structure. In some other examples, referring to FIG. 4 and FIG. 5, the first device 111 includes the first diodes 131, the second device 112 includes the second diodes 132, and the isolation structure 103 is positioned between adjacent two of the first diodes 131 and between adjacent two of the second diodes 132. This is advantageous to realizing insulation between adjacent two of the first diodes 131 and insulation between adjacent two of the second diodes 132, which is advantageous to avoiding the electric leakage in the semiconductor structure.

In some embodiments, referring to FIG. 2 and FIG. 3, the first device 111 includes the first transistors 121, the second device 112 includes the second transistors 122, the plurality of second doped regions 140 serve as sources or drains of the first transistors 121, and the plurality of third doped regions 150 serve as sources or drains of the second transistors 122.

When the first transistors 121 and the second transistors 122 include P-type transistors and the first doped region 130 includes an N-type doped region, the plurality of second doped regions 140 and the plurality of third doped regions 150 include P-type doped regions. When the first transistors 121 and the second transistors 122 include N-type transistors and the first doped region 130 includes the P-type doped region, the plurality of second doped regions 140 and the plurality of third doped regions 150 include the N-type doped regions.

In some embodiments, the doped elements in the P-type doped region may be at least one of trivalent elements such as boron, indium or gallium, and the doped elements in the N-type doped region may be at least one of pentavalent elements such as arsenic, phosphorus, and antimony.

With continued reference to FIG. 2 and FIG. 3, the semiconductor structure may also include: a first gate 104 positioned on the first side 110, the first gate 104 being at least over against a spacing between the source and the drain in the first transistor 121; and a second gate 114 positioned on the second side 120, the second gate 114 being at least over against a spacing between the source and the drain in the second transistor 122.

It is to be noted that there is also provided a first gate oxide layer 124 between the first gate 104 and the first doped region 130 between the source and the drain, and the first gate oxide layer 124 touches the first doped region 130 between two of the plurality of second doped regions 140 in first transistor 121. There is also provided a second gate oxide layer 124 between the second gate 114 and the first doped region 130 between the source and the drain, and the second gate oxide layer 134 touches the first doped region 130 between two of the plurality of third doped regions 150 in second transistor 122.

In addition, examples are taken in FIG. 2 and FIG. 3, where the orthographic projection of the first gate 104 on the first doped region 130 overlaps with the orthographic projection of the first gate oxide layer 124 on the first doped region 130, and the first gate 104 is only over against the first doped region 130 between two of the plurality of second doped regions 140 in the first transistor 121. The orthographic projection of the second gate 114 on the first doped region 130 overlaps with the orthographic projection of the second gate oxide layer 134 on the first doped region 130, and the second gate 114 is only over against to the first doped region 130 between two of the plurality of third doped regions 150 in the second transistor 122. In practical applications, the orthographic projection of the first gate 104 on the first doped region 130 may cover the first doped region 130 between two of the plurality of second doped regions 140 in the first transistor 121, and the orthographic projection of the second gate 114 on the first doped region 130 may cover the first doped region 130 between two of the plurality of third doped regions 150 in the second transistor 122.

Figure 5:
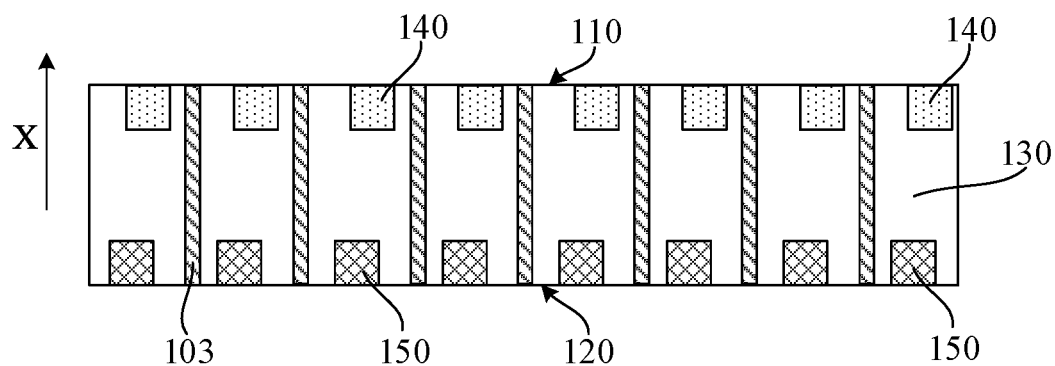

In some embodiments, referring to FIG. 4 and FIG. 5, the first device 111 includes the first diodes 131, the second device 112 includes the second diodes 132, the plurality of second doped regions 140 serve as anodes or cathodes of the first diodes 131, and the plurality of third doped regions 150 serve as anodes or cathodes of the second diodes 132.

When the plurality of second doped regions 140 and the plurality of third doped regions 150 are the P-type doped regions, the first doped region 130 is the N-type doped region, the plurality of second doped regions 140 serve as the anodes of the first diodes 131, and the plurality of third doped regions 150 serve as the cathodes of the second diodes 132. When the plurality of second doped regions 140 and the plurality of third doped regions 150 are the N-type doped regions, the first doped region 130 is the P-type doped region, the plurality of second doped regions 140 serve as the anodes of the first diodes 131, and the plurality of third doped regions 150 serve as the cathodes of the second diodes 132.

Figure 6:
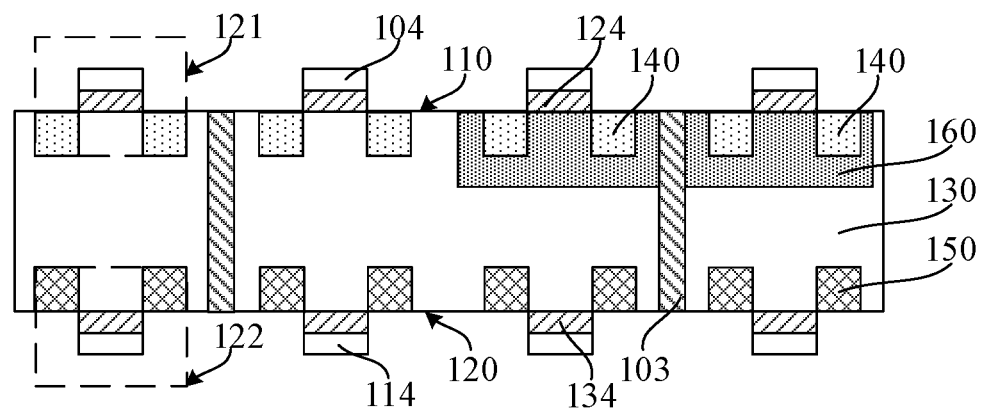
Figure 7:
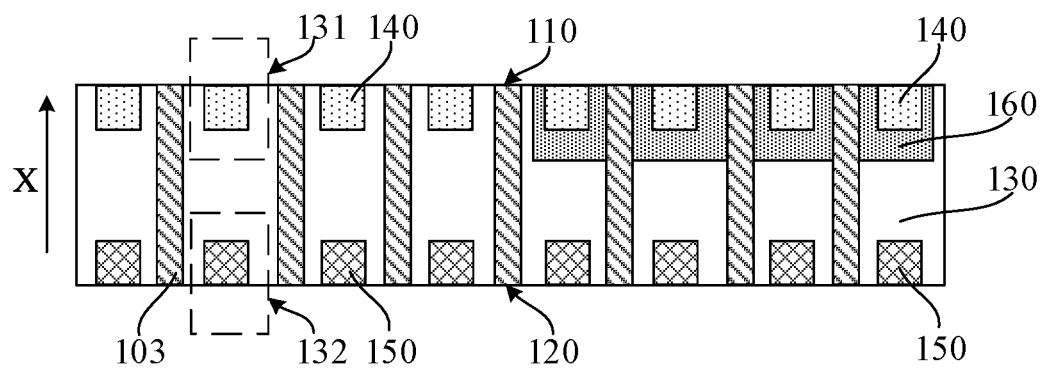

In some embodiments, referring to FIG. 6 and FIG. 7, no matter in the case where the first device 111 includes the first transistors 121 and the second device 112 includes the second transistors 122, or in the case where the first device 111 includes the first diodes 131 and the second device 112 includes the second diodes 132, a fourth doped region 160 may be provided on the surface of the first side 110 of the first doped region 130, and the plurality of second doped regions 140 are positioned on the surface of the first side 110 of the fourth doped region 160. The fourth doped region 160 and the first doped region 130 have different doping types, and the plurality of second doped regions 140 and the first doped region 130 have the same doping type.

It is to be noted that the fourth doped region 160 and the first doped region 130 have different doping types. In this case, the plurality of second doped regions 140 positioned on the first side 110 of the first doped region 130 and the plurality of second doped regions 140 positioned on the first side 110 of the fourth doped region 160 have different doping types. For example, when the first doped region 130 is the P-type doped region, the fourth doped region 160 is the N-type doped region, the plurality of second doped regions 140 on the first side 110 of the first doped region 130 are the N-type doped region, and the plurality of second doped regions 140 positioned on the first side 110 of the fourth doped region 160 are the P-type doped region. That is, the first device 111 positioned on the first side 110 of the first doped region 130 may be an N-type transistor, and the first device 111 positioned on the first side 110 of the fourth doped region 160 may be a P-type transistor. This is advantageous to increasing diversity of types of the first device 111 on the first side 110 of the base substrate 100 (referring to FIG. 3) by means of the fourth doped region 160 to meet different electrical requirements of the semiconductor structure.

Figure 8:
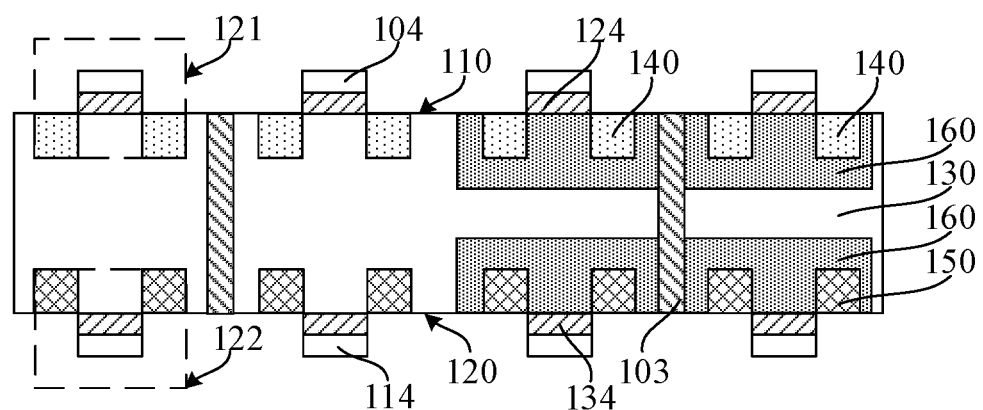
Figure 9:
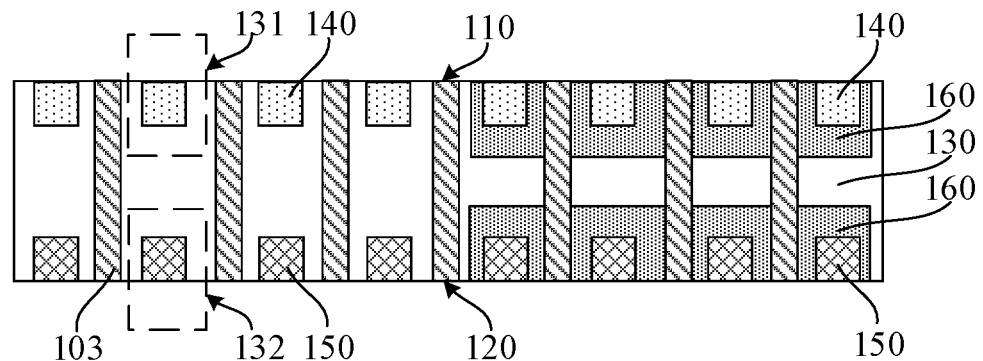

Referring to FIG. 8 and FIG. 9, the fourth doped region 160 may also be provided on the surface of the second side 120 of the first doped region 130, the plurality of third doped regions 150 are positioned on the surface of the second side 120 of the fourth doped region 160, and the plurality of third doped regions 150 and the first doped region 130 have the same doping type.

It is to be noted that the fourth doped region 160 and the first doped region 130 have different doping types. In this case, the plurality of third doped regions 150 positioned on the second side 120 of the first doped region 130 and the plurality of third doped regions 150 positioned on the second side 120 of the fourth doped region 160 have different doping types. For example, when the first doped region 130 is the P-type doped region, the fourth doped region 160 is the N-type doped region, the plurality of third doped regions 150 on the second side 120 of the first doped region 130 are the N-type doped region, and the plurality of third doped regions 150 positioned on the second side 120 of the fourth doped region 160 are the P-type doped region. That is, the second device 112 positioned on the second side 120 of the first doped region 130 may be the N-type transistor, and the second device 112 positioned on the second side 120 of the fourth doped region 160 may be the P-type transistor. This is advantageous to increasing diversity of types of the first device 112 on the first side 120 of the base substrate 100 (referring to FIG. 3) by means of the fourth doped region 160 to meet different electrical requirements of the semiconductor structure.

In addition, for the ease of description, along the direction X in the embodiments of the present disclosure, a surface positioned above the base substrate 100 is the first side 110, and a surface positioned below the base substrate 100 is the second side 120. In practical applications, along the direction X, the surface positioned above the base substrate is the second side, and the surface positioned below the base substrate is the first side, as long as the first side and the second side are opposite to each other.

In some embodiments, the first device 111 includes the first transistors 121, and the second device 112 includes the second transistors 122. In this case, referring to FIG. 10, the first transistors 121 may also include first base electrodes 170 corresponding to the plurality of second doped regions 140 one to one, wherein the first base electrodes 170 are positioned on the first side 110; and the second transistors 122 may also include second base electrodes 180 corresponding to the plurality of third doped regions 150 one to one, wherein the second base electrodes 180 are positioned on the second side 120. In addition, the fourth doped region 160 and the first doped region 130 have different doping types, thus the first base electrodes 170 in the first transistors 121 positioned on the first side 110 of the first doped region 130 have the same doping type as the first doped region 130, the first base electrodes 170 in the first transistors 121 positioned on the first side 110 of the fourth doped region 160 have the same doping type as the fourth doped region 160, the second base electrodes 180 in the second transistors 122 positioned on the second side 120 of the first doped region 130 have the same doping type as the first doped region 130, and the second base electrodes 180 in the second transistors 122 positioned on the second side 120 of the fourth doped region 160 have the same doping type as the fourth doped region 160.

Figure 10:
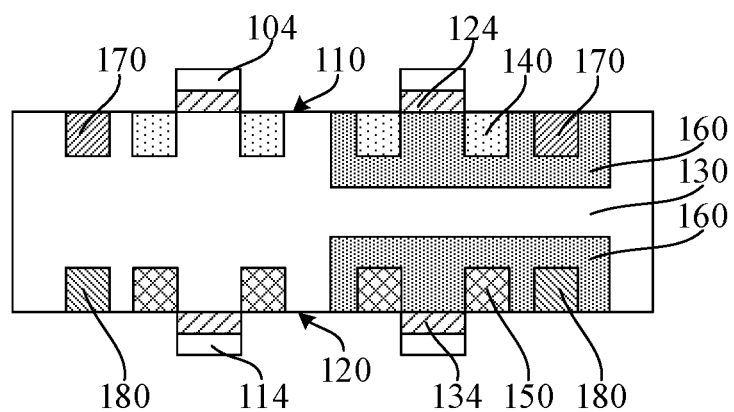

It is to be noted that FIG. 10 only shows one first transistor 121 positioned on the first side 110 of the first doped region 130, one first transistor 121 positioned on the first side 110 of the fourth doped region 160, one second transistor 122 positioned on the second side 120 of the first doped region 130, and one second transistor 122 positioned on the second side 120 of the fourth doped region 160. In practical applications, number of transistors in the above four regions is not limited.

Figure 11:
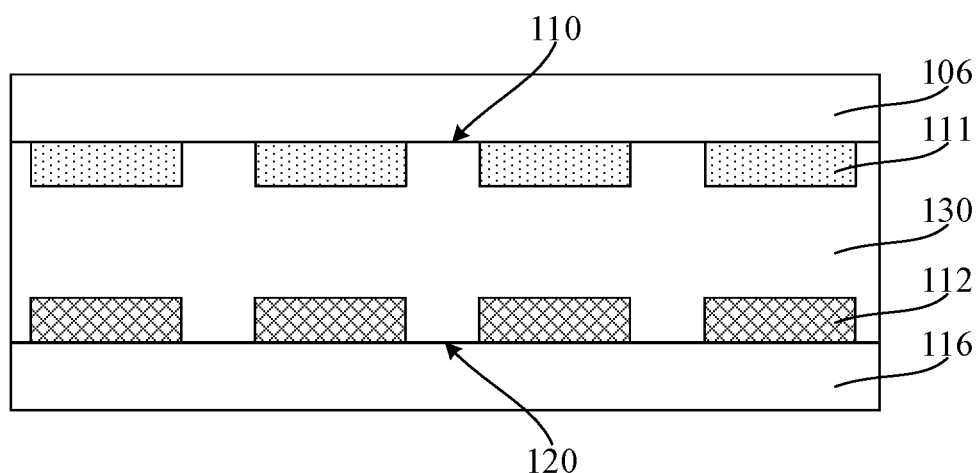

In some embodiments, referring to FIG. 11, the semiconductor structure may also include a first capacitor array 106 and/or a second capacitor array 116. The first capacitor array 106 is positioned on a side of the first device 111 away from the first side 110, and the first capacitor array 106 is electrically connected to part of the plurality of second doped regions 140 (referring to FIG. 2 and FIG. 4) in the first device 111. The second capacitor array 116 is positioned on a side of the second device 112 away from the second side 120, and the second capacitor array 116 is electrically connected to part of the plurality of third doped regions 150 (referring to FIG. 2 and FIG. 4) in the second device 112.

It is to be noted that an example is taken in FIG. 11 where the semiconductor structure includes the first capacitor array 106 and the second capacitor array 116. In practical applications, the semiconductor structure may also only include the first capacitor array 106, or only include the second capacitor array 116.

Figure 12:
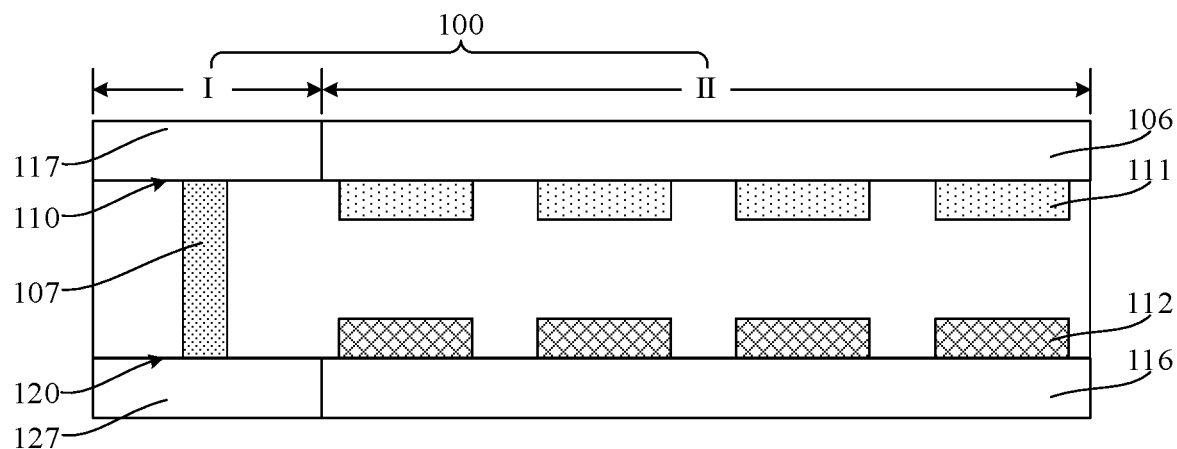

In some embodiments, referring to FIG. 12, the base substrate 100 includes a core region I and an array region II, and the first device 111 and the second device 112 are both positioned in the array region II. The semiconductor structure may also include a conductive pillar 107 positioned in the base substrate 100 of the core region I and penetrating through the base substrate 100. The conductive pillar 107 is configured to transmit an electrical signal in the base substrate 100 of the core region I to other electronic devices other than the base substrate 100, such as the capacitor arrays.

With continued reference to FIG. 12, the semiconductor structure may also include a first wiring layer 117 and/or a second wiring layer 127. The first wiring layer 117 is positioned on the first side 110 of the base substrate 100 in the core region I, the second wiring layer 127 is positioned on the second side 120 of the base substrate 100 in the core region I, and the conductive pillar 107 is electrically connected to the first wiring layer 117 and the second wiring layer 127.

In other embodiments, the first wiring layer may also be positioned on a side of the first capacitor array away from the first side; and the second wiring layer may also be positioned on a side of the second capacitor array away from the second side. Each of the first wiring layer and the second wiring layer may include a plurality of mutually spaced electrical connection layers and an interlayer dielectric layer positioned in a spacing between adjacent two of the plurality of electrical connection layers, and the conductive pillar is electrically connected to the plurality of electrical connection layers in the first wiring layer and the plurality of electrical connection layers in the second wiring layer.

To sum up, for the same base substrate 100, electronic devices are arranged on two opposite sides of the base substrate 100, wherein the electronic devices may be transistors or diodes. This is advantageous to improving the integration density of the electronic devices on the base substrate 100 without increasing the surface area of the first side 110 of the base substrate 100. Moreover, at least part of the first devices 111 and at least part of the second devices 112 share the first doped region 130, or part of the first devices 111 and part of the second devices 112 share the fourth doped region 160. This is advantageous to improving utilization rate of the base substrate 100 and increasing variety of types of the electronic device on the first side 110 and the second side 120 of the base substrate 100.

Another embodiment of the present disclosure also provides a memory including the semiconductor structure described in any one of the above embodiments. This is advantageous to arranging the electronic devices on two opposite sides of the base substrate, thus it is advantageous to improving the integration density of the electronic devices in a single memory, such that the single memory can implement more electrical functions.

Yet another embodiment of the present disclosure also provides a method for fabricating a semiconductor structure, wherein this method is configured for fabricating the semiconductor structure provided in the above embodiments. The method for fabricating a semiconductor structure provided by yet another embodiment of the present disclosure will be described in detail below with reference to the accompanying drawings. FIG. 13 to FIG. 19 are schematic structural diagrams corresponding to steps of a method for fabricating a semiconductor structure according to another embodiment of the present disclosure.

Referring to FIG. 1 to FIG. 19, the method for fabricating a semiconductor structure includes: providing a base substrate 100 including a first side 110 and a second side 120 opposite to each other; forming a first doped region 130 in the base substrate 100; forming a first device layer 101 including a first device 111 in the first side 110 of the base substrate 100; and forming a second device layer 102 including a second device 112 in the second side 120 of the base substrate 100. At least part of the first device 111 and at least part of the second device 112 share the first doped region 130.

The steps of forming the first doped region 130, the first device 111 and the second device 112 are described in detail below based on two embodiments.

In some embodiments, referring to FIG. 2 and FIG. 13 to FIG. 15, the first device 111 (referring to FIG. 1) includes first transistors 121, the second device 112 (referring to FIG. 1) includes second transistors 122, and forming the first doped region 130, the first device 111 and the second device 112 may include following steps.

Figure 13:
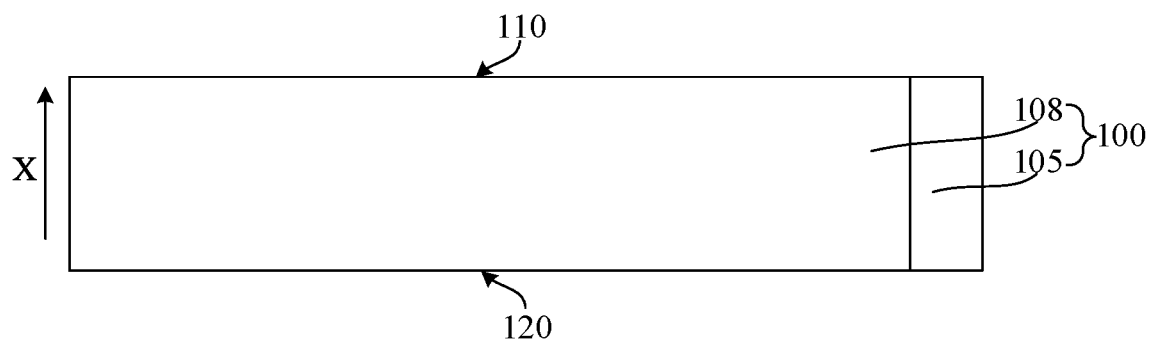
FIG. 13 to FIG. 19 are schematic structural diagrams corresponding to steps of a method for fabricating a semiconductor structure according to another embodiment of the present disclosure.

Referring to FIG. 13, the base substrate 100 is doped to form an initial doped region 108. It is to be noted that FIG. 13 illustrates part of the base substrate 100 being doped to form the initial doped region 108, the remaining base substrate 100 being a substrate 105. In other embodiments, the entire base substrate may be doped to form the initial doped region, and in subsequent FIG. 14 and FIG. 15, the entire base substrate being doped to form the initial doped region is taken as an example.

In some embodiments, along the direction X directing from the first side 110 to the second side 120, a thickness of the base substrate 100 ranges from 700 nm to 1,500 nm. The thickness of the base substrate 100 is within this range, which is advantageous to improving a doping technique to dope the entire thickness of the base substrate 100 to form the initial doped region 108 with uniform distribution of doped elements. In this way, it is convenient for subsequently forming the first doped region 130 with uniform distribution of doped elements on the basis of the initial doped region 108, to improve stability of the electrical properties of the first doped region 130.

Figure 14:
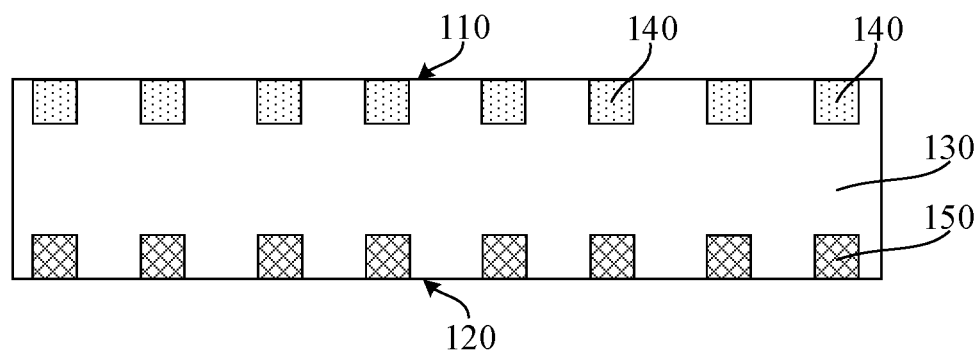

With combined reference to FIG. 13 and FIG. 14, a local region on the first side 110 of the initial doped region 108 is doped to form a second doped region 140, and a local region on the second side 120 of the initial doped region 108 is doped to form a third doped region 150, wherein the initial doped region 108 remained serves as the first doped region 130.

Figure 15:
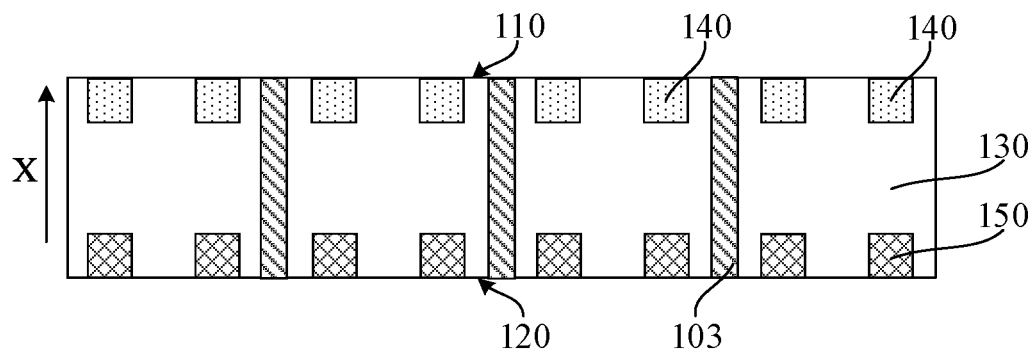

In some embodiments, referring to FIG. 15, the method for fabricating a semiconductor structure may also include: along the direction X directing from the first side 110 to the second side 120, forming, in the first doped region 130, an isolation structure 103 penetrating through the first doped region 130. The isolation structure 103 is positioned between two second doped regions 140 that subsequently form two adjacent first transistors, and is positioned between two third doped regions 150 that subsequently form two adjacent second transistors. Part of the second doped regions 140 and the first doped region 130 constitute a part of the first transistors, and part of the third doped regions 150 and the first doped region 130 constitute a part of the second transistors.

In some embodiments, referring to FIG. 2, the method for fabricating a semiconductor structure may also include forming a first gate 104 and a second gate 114. The first gate 104 is over against a spacing between the two second doped regions 140 in the first transistor 121, and the second gate 114 is over against a spacing between the two third doped regions 150 in the second transistor 122. In addition, before the first gate 104 and the second gate 114 are formed, a first gate oxide layer 124 is also formed between the first gate 104 and the spacing between the two second doped regions 140 in the first transistor 121; and a second gate oxide layer 134 is also formed between the second gate 114 and the spacing between the two third doped regions 150 in the second transistor 122.

In some embodiments, referring to FIG. 10, the method for fabricating a semiconductor structure may also include: forming first base electrodes 170 corresponding to the second doped regions 140 one to one, wherein the first base electrodes 170 are positioned on the first side 110; and forming second base electrodes 180 corresponding to the third doped regions 150 one to one, wherein the second base electrodes 180 are positioned on the second side 120.

In some other embodiments, referring to FIG. 4, FIG. 13 and FIG. 14, the first device 111 (referring to FIG. 1) includes first diodes 131, and the second device 112 (referring to FIG. 1) includes second diodes 132. The forming the first doped region 130, the first device 111 and the second device 112 may include following steps.

With continued reference to FIG. 13, the base substrate 100 is doped to form the initial doped regions 108. It is to be noted that in FIG. 16, the entire base substrate 100 being doped to form the initial doped region 108 is taken as an example.

With combined reference to FIG. 13 and FIG. 14, the local region on the first side 110 of the initial doped region 108 is doped to form the second doped region 140, and the local region on the second side 120 of the initial doped region 108 is doped to form the third doped region 150, wherein the initial doped region 108 remained serves as the first doped region 130. One of the second doped regions 140 and the first doped region 130 constitute one of the first diodes 131, and one of the third doped regions 150 and the first doped region 130 constitute one of the second diodes 132.

In some embodiments, referring to FIG. 4, the method for fabricating a semiconductor structure may also include: along the direction X directing from the first side 110 to the second side 120, forming, in the first doped region 130, an isolation structure 103 penetrating through the first doped region 130. The isolation structure 103 is positioned between two adjacent second doped regions 140 and is positioned between two adjacent third doped regions 150.

Figure 16:
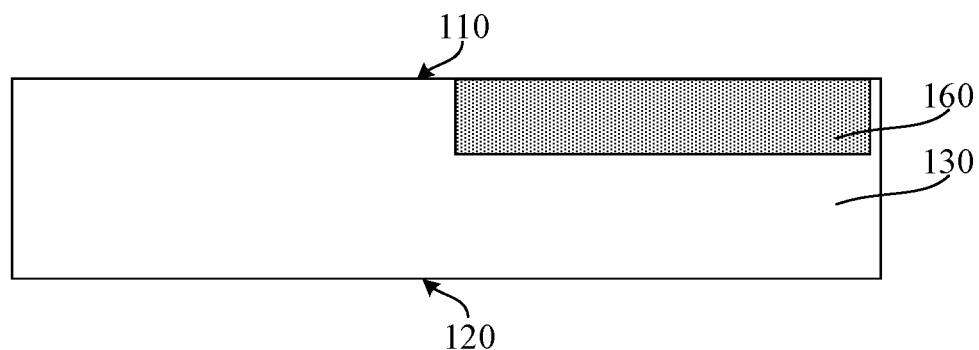

In the above two embodiments, referring to FIG. 16, after forming the first doped region 130 and before forming the second doped regions 140 (referring to FIG. 14) and the third doped regions 150 (referring to FIG. 14), the method for fabricating a semiconductor structure may also include: doping the local region on the first side 110 of the first doped region 130 to form a fourth doped region 160, wherein the fourth doped region 160 and the first doped region 130 have different doping types.

Figure 17:
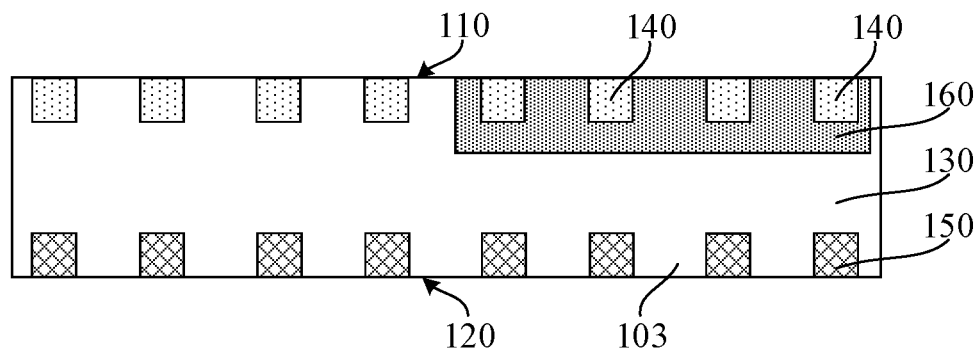

Referring to FIG. 17, the step of forming the second doped regions 140 may also include: doping the local region on the first side 110 of the fourth doped region 160 to form the second doped regions 140, wherein the second doped regions 140 and the first doped region 130 have the same doping type. This is advantageous to increasing diversity of types of the first device 111 (referring to FIG. 1) on the first side 110 of the base substrate 100 (referring to FIG. 1) by forming the fourth doped region 160, to meet different electrical requirements of the semiconductor structure.

It is to be noted that referring to FIG. 6 and FIG. 7, steps of forming the isolation structure 103, the first gate 104, the second gate 114, the first gate oxide layer 124 and the second gate oxide layer 134 subsequently on the basis of FIG. 17 are the same as the foregoing descriptions, and thus their descriptions are omitted here.

Figure 18:
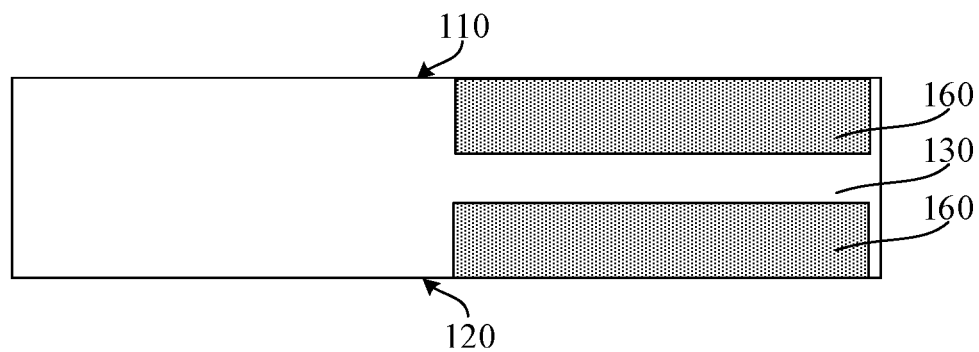

Referring to FIG. 18, after forming the first doped region 130 and before forming the second doped regions 140 (referring to FIG. 14) and the third doped regions 150 (referring to FIG. 14), the method for fabricating a semiconductor structure may also include: doping the local region on the second side 120 of the first doped region 130 to form the fourth doped region 160.

Figure 19:
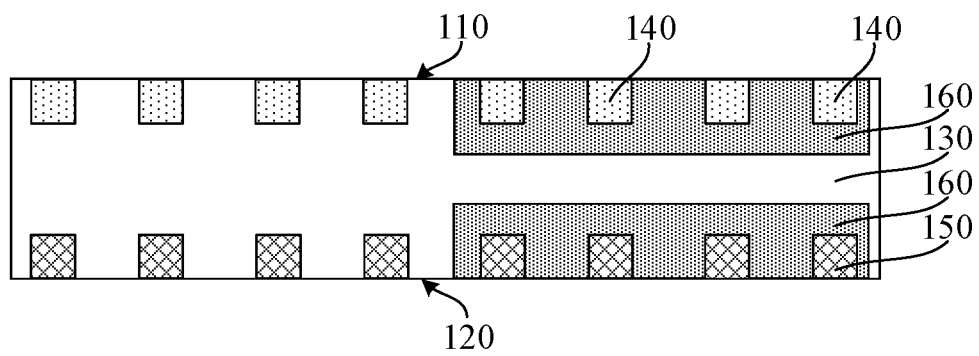

Referring to FIG. 19, the step of forming the third doped regions 150 may also include: doping a local region of the second side 120 of the fourth doped region 160 to form the third doped regions 150, wherein the third doped regions 150 and the first doped region 130 have the same doping type.

It is to be noted that referring to FIG. 8 and FIG. 9, steps of forming the isolation structure 103, the first gate 104, the second gate 114, the first gate oxide layer 124 and the second gate oxide layer 134 subsequently on the basis of FIG. 19 are the same as the foregoing descriptions, and thus their descriptions are omitted here.

In some embodiments, referring to FIG. 11, the method for fabricating a semiconductor structure may also include: forming a first capacitor array 106 and/or a second capacitor array 116. The first capacitor array 106 is positioned on a side of the first device 111 away from the first side 110, and the first capacitor array 106 is electrically connected to part of the second doped regions 140 (referring to FIG. 14) in the first device 111. The second capacitor array 116 is positioned on a side of the second device 112 away from the second side 120, and the second capacitor array 116 is electrically connected to part of the third doped regions 150 (referring to FIG. 14) in the second device 112.

In some embodiments, referring to FIG. 12, the base substrate 100 includes a core region I and an array region II, and the first device 111 and the second device 112 are both positioned in the array region II. The method for fabricating a semiconductor structure may also include: forming a conductive pillar 107 in the base substrate 100 of the core region I, wherein the conductive pillar 107 penetrates through the base substrate 100 of the core region I.

In some embodiments, with continued reference to FIG. 12, the method for fabricating a semiconductor structure may also include: forming a first wiring layer 117 and/or a second wiring layer 127. The first wiring layer 117 is positioned on the first side 110 of the base substrate 100 in the core region I, the second wiring layer 127 is positioned on the second side 120 of the base substrate 100 in the core region I, and the conductive pillar 107 is electrically connected to the first wiring layer 117 and the second wiring layer 127.

It is to be noted that the relevant details of the above-mentioned various structures that are the same as the disclosed embodiments of the semiconductor structure provided above are not to be repeated here.

In summary, electronic devices (i.e., the first devices 111 and the second devices 112) are formed on two opposite sides of the base substrate 100, wherein the electronic devices may be transistors or diodes. This is advantageous to improving the integration density of the electronic devices on the base substrate 100 without increasing the surface area of the first side 110 of the base substrate 100. Moreover, at least part of the first devices 111 and at least part of the second devices 112 share the first doped region 130, or part of the first devices 111 and part of the second devices 112 share the fourth doped region 160. This is advantageous to improving utilization rate of the base substrate 100 and increasing variety of types of the electronic device on the first side 110 and the second side 120 of the base substrate 100.

Those of ordinary skill in the art can understand that the above-mentioned embodiments are some embodiments for implementing the present disclosure, but in practical applications, various changes may be made to them in form and details without departing from the spirit and scope of the embodiments of the present disclosure. Any person skilled in the art can make their own changes and modifications without departing from the spirit and scope of the embodiments of the present disclosure. Therefore, the protection scope of the embodiments of the present disclosure shall be subject to the scope defined by the claims.

What is claimed is:

1. A semiconductor structure, comprising:
a base substrate including a first side and a second side opposite to each other;
a first device layer including a first device, the first device layer being arranged on the first side of the base substrate; and
a second device layer including a second device, the second device layer being arranged on the second side of the base substrate;
wherein at least part of the first device and at least part of the second device share a first doped region.

2. The semiconductor structure according to claim 1, wherein the first device comprises first transistors, the second device comprising second transistors, and at least part of the first transistors and at least part of the second transistors sharing the first doped region.

3. The semiconductor structure according to claim 2, wherein the first transistors and the second transistors comprise P-type transistors, the first doped region comprising an N-type doped region, and the P-type transistors sharing the N-type doped region.

4. The semiconductor structure according to claim 2, wherein the first transistors and the second transistors comprise N-type transistors, the first doped region comprising a P-type doped region, and the N-type transistors sharing the P-type doped region.

5. The semiconductor structure according to claim 1, wherein the first device comprises first diodes, the second device comprising second diodes, and at least part of the first diodes and at least part of the second diodes sharing the first doped region.

6. The semiconductor structure according to claim 2, wherein a first side of the first doped region is provided with a plurality of second doped regions, a second side of the first doped region being provided with a plurality of third doped regions, the plurality of second doped regions and the plurality of third doped regions having a same doping type, and the first doped region and the plurality of second doped regions having different doping types.

7. The semiconductor structure according to claim 6, wherein an orthographic projection of each of the plurality of second doped regions on the base substrate at least partially overlaps with an orthographic projection of each of the plurality of third doped regions on the base substrate.

8. The semiconductor structure according to claim 6, wherein along a direction directing from the first side to the second side, the first doped region is further provided with an isolation structure penetrating through the first doped region, the isolation structure being positioned between adjacent two of the first devices and between adjacent two of the second devices.

9. The semiconductor structure according to claim 6, wherein the first device comprises first diodes, the second device comprising second diodes, the plurality of second doped regions serving as anodes or cathodes of the first diodes, and the plurality of third doped regions serving as anodes or cathodes of the second diodes.

10. The semiconductor structure according to claim 6, wherein the first device comprises first transistors, the second device comprising second transistors, the plurality of second doped regions serving as sources or drains of the first transistors, and the plurality of third doped regions serving as sources or drains of the second transistors.

11. The semiconductor structure according to claim 10, further comprising: a first gate positioned on the first side, the first gate being at least over against a spacing between the source and the drain in the first transistor; and a second gate positioned on the second side, the second gate being at least over against a spacing between the source and the drain in the second transistor.

12. The semiconductor structure according to claim 6, wherein a first side surface of the first doped region is provided with a fourth doped region, the plurality of second doped regions being positioned on a first side surface of the fourth doped region, the fourth doped region and the first doped region having different doping types, and the plurality of second doped regions and the first doped region having the same doping type.

13. The semiconductor structure according to claim 12, wherein a second side surface of the first doped region is provided with the fourth doped region, the plurality of third doped regions being positioned on a second side surface of the fourth doped region, and the plurality of third doped regions and the first doped region having the same doping type.

14. The semiconductor structure according to claim 1, wherein along a direction directing from the first side to the second side, a thickness of the first doped region ranges from 700 nm to 1,500 nm.

15. A memory comprising a semiconductor structure, wherein the semiconductor structure comprises:
   a base substrate including a first side and a second side opposite to each other;
   a first device layer including a first device, the first device layer being arranged on the first side of the base substrate; and
   a second device layer including a second device, the second device layer being arranged on the second side of the base substrate;
   wherein at least part of the first device and at least part of the second device share a first doped region.

16. A method for fabricating a semiconductor structure, the method comprising:
   providing a base substrate including a first side and a second side opposite to each other;
   forming a first doped region in the base substrate;
   forming a first device layer including a first device in the first side of the base substrate; and
   forming a second device layer including a second device in the second side of the base substrate;
   wherein at least part of the first device and at least part of the second device share the first doped region.

17. The fabrication method according to claim 16, wherein the first device comprises first transistors, the second device comprising second transistors, and forming the first doped region, the first device and the second device comprising:
   doping the base substrate to form an initial doped region;
   doping a local region on a first side of the initial doped region to form second doped regions; and
   doping a local region on a second side of the initial doped region to form third doped regions, the initial doped region remained serving as the first doped region; wherein
   part of the second doped regions and the first doped region constitute a part of the first transistor, and part of the third doped regions and the first doped region constituting a part of the second transistor.

18. The fabrication method according to claim 16, wherein the first device comprises first diodes, the second device comprising second diodes, and forming the first doped region, the first device and the second device comprising:
   doping the base substrate to form an initial doped region;
   doping a local region on a first side of the initial doped region to form second doped regions; and
   doping a local region on a second side of the initial doped region to form third doped regions, the initial doped region remained serving as the first doped region; wherein
   one of the second doped regions and the first doped region constitute one of the first diodes, and one of the third doped regions and the first doped region constituting one of the second diodes.

19. The fabrication method according to claim 17, wherein after forming the first doped region and before forming the second doped regions and the third doped regions, the fabrication method further comprises:
   doping a local region on a first side of the first doped region to form a fourth doped region, the fourth doped region and the first doped region having different doping types; and
   forming the second doped regions further comprises:
   doping a local region on a first side of the fourth doped region to form the second doped regions, the second doped regions and the first doped regions having the same doping type.

20. The fabrication method according to claim 19, wherein after forming the first doped region and before forming the second doped regions and the third doped regions, the fabrication method further comprises:
   doping a local region on a second side of the first doped region to form the fourth doped region; and
   forming the third doped regions further comprises: doping a local region on a second side of the fourth doped region to form the third doped regions, the third doped regions and the first doped regions having the same doping type.

* * * * *